(12) United States Patent
Dmitriev et al.

(10) Patent No.: US 8,092,597 B2
(45) Date of Patent: *Jan. 10, 2012

(54) METHOD AND APPARATUS FOR FABRICATING CRACK-FREE GROUP III NITRIDE SEMICONDUCTOR MATERIALS

(75) Inventors: Vladimir A. Dmitriev, Gaithersburg, MD (US); Yuri V. Melnik, Rockville, MD (US)

(73) Assignee: Freiberger Compound Materials GmbH, Freiberg/Sachsen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/011,879

(22) Filed: Jan. 22, 2011

(65) Prior Publication Data

US 2011/0114015 A1   May 19, 2011

Related U.S. Application Data

(60) Continuation of application No. 12/235,370, filed on Sep. 22, 2008, now abandoned, which is a continuation of application No. 11/483,455, filed on Jul. 10, 2006, now abandoned, which is a division of application No. 10/778,633, filed on Feb. 13, 2004, now Pat. No. 7,501,023, and a continuation-in-part of application No. 10/355,426, filed on Jan. 31, 2003, now Pat. No. 6,936,357, which is a continuation-in-part of application No. 09/900,833, filed on Jul. 6, 2001, now Pat. No. 6,613,143, said application No. 10/778,633 is a continuation-in-part of application No. 09/903,047, filed on Jul. 11, 2001, now abandoned, which is a continuation of application No. 09/900,833, filed on Jul. 6, 2001, now Pat. No. 6,613,143, said application No. 10/778,633 is a continuation-in-part of application No. 10/632,736, filed on Aug. 1, 2003, now Pat. No. 7,279,047, which is a continuation of application No. 09/903,299, filed on Jul. 11, 2001, now Pat. No. 6,656,285, which is a continuation of application No. 09/900,833, filed on Jul. 6, 2001, now Pat. No. 6,613,143.

(60) Provisional application No. 60/449,085, filed on Feb. 21, 2003.

(51) Int. Cl.
*C30B 25/00* (2006.01)

(52) U.S. Cl. ............... 117/99; 117/84; 117/88; 117/91; 117/94; 117/97; 117/106; 117/915; 117/952

(58) Field of Classification Search .................... 117/84, 117/88, 91, 94, 97, 99, 106, 915, 952
See application file for complete search history.

(56) References Cited

U.S. PATENT DOCUMENTS 5,587,014 A   12/1996   Iyechika et al.
(Continued)

FOREIGN PATENT DOCUMENTS

JP   2002542142   12/2002
(Continued)

OTHER PUBLICATIONS

Japanese Office Action dated Apr. 26, 2011, from JP published application 2005-225756: published Aug. 25, 2005.

*Primary Examiner* — Matthew Song
(74) *Attorney, Agent, or Firm* — A.C. Entis-IP Ltd.

(57) ABSTRACT

Method for producing a III-N (AlN, GaN, $Al_xGa_{(1-x)}N$) crystal by Vapor Phase Epitaxy (VPE), the method comprising: providing a reactor having: a growth zone for growing a III-N crystal; a substrate holder located in the growth zone that supports at least one substrate on which to grow the III-N crystal; a gas supply system that delivers growth material for growing the III-N crystal to the growth zone from an outlet of the gas supply system; and a heating element that controls temperature in the reactor; determining three growth sub-zones in the growth zone for which a crystal grown in the growth sub-zones has respectively a concave, flat or convex curvature; growing the III-N crystal on a substrate in a growth region for which the crystal has a by desired curvature.

19 Claims, 2 Drawing Sheets

U.S. PATENT DOCUMENTS

| | | | |
|---|---|---|---|
| 6,156,581 A * | 12/2000 | Vaudo et al. | 438/22 |
| 6,179,913 B1 * | 1/2001 | Solomon et al. | 117/99 |
| 6,218,269 B1 | 4/2001 | Nikolaev et al. | |
| 6,573,164 B2 | 6/2003 | Tsvetkov et al. | |
| 6,656,272 B2 | 12/2003 | Tsvetkov et al. | |
| 6,660,083 B2 | 12/2003 | Tsvetkov et al. | |
| 6,890,809 B2 | 5/2005 | Karpov et al. | |
| 7,501,023 B2 * | 3/2009 | Dmitriev et al. | 117/99 |
| 7,611,586 B2 | 11/2009 | Melnik et al. | |
| 2001/0000733 A1 * | 5/2001 | Tomioka | 427/8 |

FOREIGN PATENT DOCUMENTS

| | | |
|---|---|---|
| JP | 2003527296 | 9/2003 |
| WO | 0063466 | 10/2000 |
| WO | 0168955 | 9/2001 |

* cited by examiner

METHOD AND APPARATUS FOR FABRICATING CRACK-FREE GROUP III NITRIDE SEMICONDUCTOR MATERIALS

CROSS REFERENCE TO RELATED APPLICATIONS

This application is a continuation of co-pending U.S. application Ser. No. 12/235,370, filed Sep. 22, 2008, which is a continuation of U.S. application Ser. No. 11/483,455, filed Jul. 10, 2006, now abandoned, which is a divisional of and claims the benefit of U.S. application Ser. No. 10/778,633, filed Feb. 13, 2004, now U.S. Pat. No. 7,501,023;

U.S. application Ser. No. 10/778,633 claiming the benefit of the filing date of U.S. Provisional Application No. 60/449,085, filed Feb. 21, 2003;

U.S. application Ser. No. 10/778,633 claiming the benefit of and being a continuation-in-part application of U.S. application Ser. No. 10/355,426, filed Jan. 31, 2003, now U.S. Pat. No. 6,936,357, which is a continuation-in-part of U.S. application Ser. No. 09/900,833, filed Jul. 6, 2001, now U.S. Pat. No. 6,613,143;

U.S. application Ser. No. 10/778,633 claiming the benefit of and being a continuation-in-part of U.S. application Ser. No. 09/903,047, filed Jul. 11, 2001, which is a continuation of U.S. application Ser. No. 09/900,833, filed Jul. 6, 2001, now U.S. Pat. No. 6,613,143;

U.S. application Ser. No. 10/778,633 claiming the benefit of and being a continuation-in-part of U.S. application Ser. No. 10/632,736, filed Aug. 1, 2003, now U.S. Pat. No. 7,279,047, which is a continuation of U.S. application Ser. No. 09/903,299, filed Jul. 11, 2001, now U.S. Pat. No. 6,656,285, which is a continuation of U.S. application Ser. No. 09/900,833, filed Jul. 6, 2001, now U.S. Pat. No. 6,613,143;

the priority of all of which are claimed under 35 U.S.C. §§119 and 120, and the disclosures of all of which are incorporated herein by reference for any and all purposes.

FIELD OF THE INVENTION

The present invention relates generally to semiconductor materials and, more particularly, to a method and apparatus for growing Group III nitride semiconductor materials with improved characteristics.

BACKGROUND

Group III nitride materials (e.g., GaN, AlN, InN, BN, and their alloys) are perspective semiconductor materials for the next generation of high power, 5 high frequency, high temperature electronic devices, including short wavelength optoelectronic devices. Unfortunately, these materials suffer from a variety of problems that limit their performance as well as their commercial viability.

One of the principal problems associated with Group III nitride materials is their tendency to crack, a problem that has been described in numerous scientific papers. During the growth of the Group III nitride, as soon as its thickness reaches a certain value, typically on the order of a few microns or less, cracks are formed in the growing layer. Occasionally cracks even form in the substrate on which the layer is being grown. As a result, devices that would otherwise benefit from the use of thick Group III nitride layers are prohibited.

Accordingly, a means of fabricating thick Group III nitride layers and wafers is desired. The present invention provides such a means.

SUMMARY

The present invention provides a method and apparatus for growing low defect, optically transparent, colorless, crack-free single crystal Group III nitride epitaxial layers with a thickness exceeding 10 microns. These layers can be grown on large area substrates. Suitable substrate materials include silicon (Si), silicon carbide (SiC), sapphire, gallium nitride (GaN), aluminum nitride (AlN), gallium arsenide (GaAs), aluminum gallium nitride (AlGaN) and others.

In one aspect of the invention, monocrystalline, crack-free Group III nitride layers are grown using gas transport techniques based on the hydride vapor phase epitaxial (HVPE) approach. During growth, the shape and the stress of the nitride epitaxial layers can be controlled, thus allowing concave, convex 30 and flat layers to be controllably grown. The crack-free Group III nitride layer can be grown to a thickness of at least 1 micron and, depending upon the desired application, to a thickness of greater than 5 microns, 10 microns, 15 microns, 20 microns, 30 microns, 50 microns, 1 mm or more. The Group III nitride layer can be grown on any of a variety of substrates, including substrates of Si, SiC, sapphire, quartz, GaN, GaAs, AlN and AlGaN, with substrate sizes ranging from 2 inches to 6 inches or more. Assuming that the grown Group III nitride layer is formed of AlN, the material is electrically insulating with an electrical resistivity at 300 K of at least $10^6$ Ohm-cm. Defect density in the as-grown layer is less than $10^8$ cm$^{-2}$, and can be held to levels of less than $10^6$ cm$^{-2}$ or even less than $10^4$ cm$^{-2}$. Thickness uniformity of the as-grown layer is better than 10 percent, typically on the order of between 1 and 5 percent. Thermal conductivity of the as-grown AlN layer is 3 W/K-cm or greater. The surface of the grown layer can be polished to a surface roughness rms of less than 0.5 nm, and if desired to a surface roughness rms of less than 0.3 nm or less than 0.1 nm In another aspect of the invention, a method and apparatus for producing free-standing, monocrystalline, crack-free, low defect Group III nitride wafers is provided. Preferably the Group III nitride wafers are comprised of AlN and are grown on SiC substrates. After the growth of the AlN is completed, the substrate is removed. The thickness of the MN wafer can exceed 5 mm with diameters larger than 2, 3, 4 or even 6 inches being achievable. As such, the volume of the AlN wafer can exceed 10 cm$^3$, more preferably 100 cm$^3$, and still more preferably 200 cm$^3$. The defect density of the electrically insulating wafers is less than $10^8$ cm$^{-2}$, and preferably less than $10^6$ cm$^{-2}$. Once initial fabrication of the wafer is complete, the wafer can be sliced into thinner AlN wafers. The resultant AlN wafers can be polished and prepared to provide epi ready surfaces of varying orientation, including (0001) Al face and (000-1)N face.

In another aspect of the invention, a semiconductor device comprising at least one thick, monocrystalline, crack-free AlN layer is provided. The thickness of the AlN layer is typically in the range of between 1 micron and 50 microns, although thicker layers can be used. The semiconductor device can be an electronic device or an opto-electronic device. The semiconductor device can contain one or more heterojunctions or homojunctions, for example 3 comprised of AlGaN/AlGaN. The device can also include doped and/or undoped nitride epitaxial layers. Preferably the substrate is of SiC or AlN, although other substrates can also be used.

A further understanding of the nature and advantages of the present invention can be realized by reference to the remaining portions of the specification and the drawings.

DESCRIPTION OF THE SPECIFIC EMBODIMENTS

Methodology

Gas Phase Growth

Figure 1:
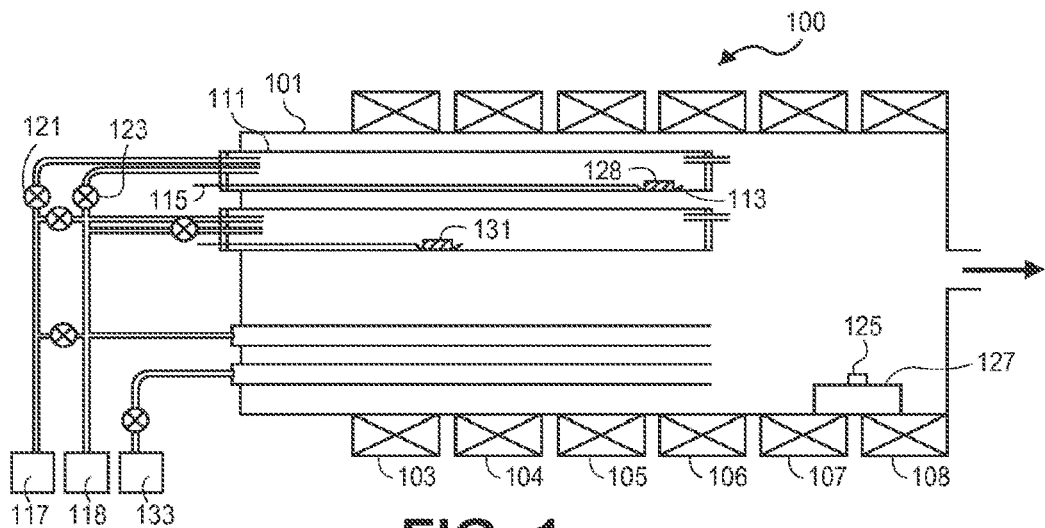
FIG. 1 is a schematic illustration of a horizontal furnace suitable for use with the invention.

In order to grow crack-free Group III nitride materials from the gas phase, preferably a modified hydride vapor phase epitaxial (HVPE) approach is used with a horizontal reactor tube as illustrated in FIG. 1. Although a horizontal reactor 101 is preferred as it easily accommodates the required sources, it is understood that the invention is not limited to a particular furnace configuration 4 as other configurations (e.g., vertical furnaces) that offer the required control over the temperature, temperature zone or zones, gas flow, source and substrate locations, source configurations, etc., can also be used.

The furnace is comprised of multiple temperature zones, preferably obtained through the use of multiple heaters, each of which at least partially surrounds the reactor tube and each of which preferably has its own temperature controller. In the preferred embodiment, a six zone configuration with resistive heaters 103-108 is used. Although reactor tube 101 preferably has a cylindrical cross-section, other configurations can be used such as a 'tube' with a rectangular cross-section. Within the reactor tube are one or more source tubes 111. As noted with respect to the reactor tube, source tube 111 preferably has a cylindrical cross-section although the invention is not limited to cylindrical source tubes. Furthermore, it will be appreciated that as used herein, the terms source tube and source channel are interchangeable and considered to be equivalent.

In order to grow undoped thick crack-free AlN, at least one single Al source tube is required (e.g., source tube 111). It will be appreciated that in order to grow other Group III nitride materials, sources other than, or in combination with, Al must be used (e.g., Ga). Within source tube is a source boat 113. As used herein, the term "boat" simply refers to a means of holding the source material. For example, boat 113 can be comprised of a portion of a tube with a pair of end portions. Alternately, the source material can be held within the source tube without the use of a separate boat. Alternate boat configurations are clearly envisioned by the inventors.

In at least one embodiment of the invention, the desired growth temperature depends upon the stage of crystal growth (e.g., crystal nucleation versus high growth rate). Accordingly the temperature of a source is preferably controllable, for example by varying the heat applied by specific zone heaters.

In at least one preferred embodiment of the invention, the location of a particular source within reactor tube 101 can be controllably varied, typically by altering the position of the source. For example, in source tube 111 a control rod 115 is coupled to boat 113, control rod 115 allowing the position of boat 113 and thus the source within the boat to be varied within the reactor. Control rod 115 can be manually manipulated, as provided for in the illustrated configuration, or coupled to a robotic positioning system (not shown).

Coupled to each source tube are one or more sources of gas (e.g., gas sources 117 and 119). The rate of gas flow through a particular source tube is controlled via valves (e.g., valves 121 and 123), either manually or by an automatic processing system.

At least one substrate 125 is located on a pedestal 127 within the growth zone of reactor. Although typically multiple substrates are manually loaded into the reactor for co-processing, a single substrate can be processed with the invention. Additionally, substrates can be automatically positioned within the furnace for automated production runs. In order to vary the temperature of the growth zone, and thus the temperature of the substrate or substrates, either the position of the substrates within the reactor is changed or the amount of heat applied by heaters proximate to the growth zone is varied.

Although reactor 100 is preferably a hot-wall, horizontal reactor and the process is carried out in an inert gas flow at atmospheric pressure, other reactor configurations can be used to perform the modified HYPE process of the invention. Preferably source tube 111 and source boat 113 are comprised of quartz. Other materials can be used for boat 113, however, such as sapphire or silicon carbide. Within boat 113, or simply within tube 111 if no separate boat is used, is source 129. Assuming that the invention is to be used to grow AlN, source 129 is comprised of aluminum metal.

In order to achieve extended growth and thus the growth of very thick layers, the inventors have found that multiple sources are preferably used, the sources being maintained at more than one temperature in order to limit the amount of source participating in the layer forming reaction. For example, assuming that the intended layer is to be comprised of AlN, reactor 100 includes at least two Al sources (e.g., sources 129 and 131). During layer formation, the temperature of the source designated to participate in the reaction is held at a relatively high temperature, typically between 750° C. and 850° C. and preferably at a temperature of approximately 800° C., while the second (or additional) sources are maintained at a lower temperature. By using multiple sources it is possible to replace one source (e.g., a depleted source) while continuing the growth process with a different source.

In order to grow thick crack-free AlN according to the preferred embodiment of the invention using a modified HYPE approach, a source 117 of halide gas, preferably HCl, is coupled to the source tube(s) along with a source 119 of inert gas, preferably Ar, which is used as a carrier gas to transfer materials from the source tubes to the growth zone. A source 133 of nitrogen containing gas, preferably ammonia gas, is also coupled to reactor. Substrate crystal pedestal 127 is preferably fabricated from quartz, although other materials such as silicon carbide or graphite can also be used.

In order to grow thick AlN, preferably substrate(s) 125 is comprised of SiC or AlN, thus providing a lattice and coefficient of thermal expansion match between the seed and the material to be grown. As a result of using AlN substrates, improved quality in the as-grown material is achieved. Alternately, substrates can be comprised of sapphire, GaAs, GaN, or other material as previously noted. Assuming the use of AlN substrates, the substrates can have less than $10^{18}$ cm$^{-3}$ oxygen atomic concentration, less than $10^{19}$ cm$^{-3}$ oxygen atomic concentration, or less than $10^{20}$ cm$^{-3}$ oxygen atomic concentration. The FWHM of the .omega.-scan x-ray (0002) rocking curve for the seed substrate can range from 60 arc seconds to 10 arc degrees. Although the diameter of the substrate depends on the size of the reactor, the inventors have found that the invention is not limited to any specific substrate size (i.e., diameters of 1 inch, 2 inches, 3 inches, 4 inches, 5 inches, 6 inches and greater can be used). Similarly the inventors have found that the invention can use substrates of thickness 0.1 mm, 0.2 mm, 0.3 mm, 0.4 mm, 0.5 mm or greater.

Prior to layer growth, the substrate can be polished and/or etched by reactive ion etching (RIE) or wet etching. After introduction into the growth zone, HCl, aluminum chloride, or a gas mixture containing HCl and aluminum chloride can be used to etch the substrate. The surface of the substrate can have a (000-1)N or a (0001) Al polarity. The surface can be mis-oriented from the (0001) crystallographic plane at an angle ranging from 0 to 90 degrees. Additionally the seed substrate can contain cracks with a density from 0 to 10,000 per micron while still resulting in crack-free layer growth. The substrate(s) can be mounted face up or face down within the reactor. Alternately, substrates can be simultaneously fixed to the substrate holder in both the face up and face down configurations, such configuration increasing the number of wafers that can be grown in a single run.

Initially reactor 100 is flushed and filled with an inert gas, preferably Ar, from gas source 119. The inert gas can enter the reactor through the source tube(s), thereby flushing the source tube(s), through a separate entry line (not shown), or both. The flow of inert gas is controlled by a metering valve and is typically in the range of 1 to 25 liters per minute. Substrate(s) 125 is then heated to the desired growth temperature. In one embodiment of the invention the growth zone, and thus the substrates within the growth zone, are heated to a temperature within the range of 600° C. to 1500° C., more preferably within the range of 850° C. to 1050° C., and still more preferably within the range of 900° C. to 950° C., and yet still more preferably within the range of 900° C. to 920° C. Although temperatures within the most preferable range yield relatively slow growth rates, these temperatures assure a higher quality material in the as-grown crystal.

Figure 2:
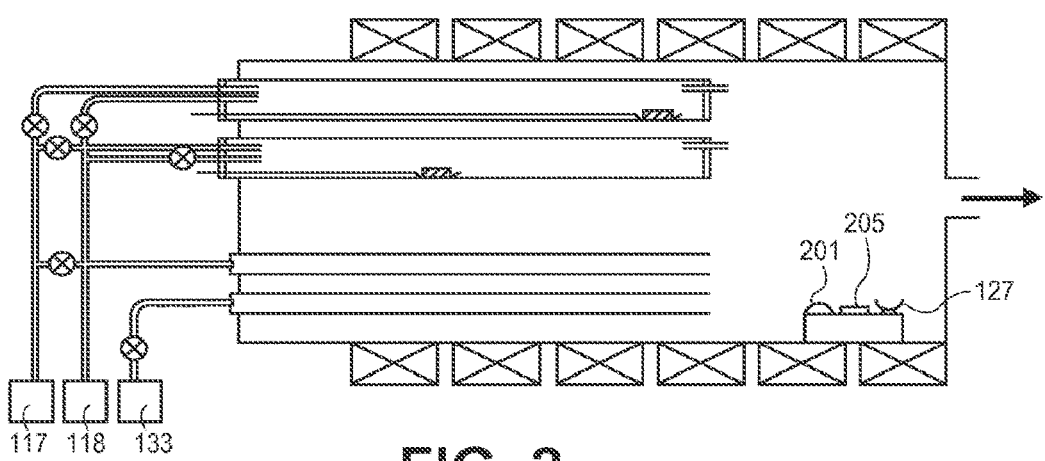
FIG. 2 illustrates the three growth sub-zones located in the reactor shown in FIG. 1.

In a preferred embodiment of the invention and as illustrated in FIG. 2, the growth zone is comprised of three growth sub-zones defined, in part, by the temperature within the zones. The growth sub-zone located closest to the source zone and having the lowest growth temperature yields layers with a generally convex shape (e.g., sample 201). The growth sub-zone located farthest from the source zone and having the highest temperature yields layers with a generally concave shape (e.g., sample 203). The growth sub-zone located between these first two sub-zones yields substantially flat layer growth (e.g., sample 205).

Figure 3:
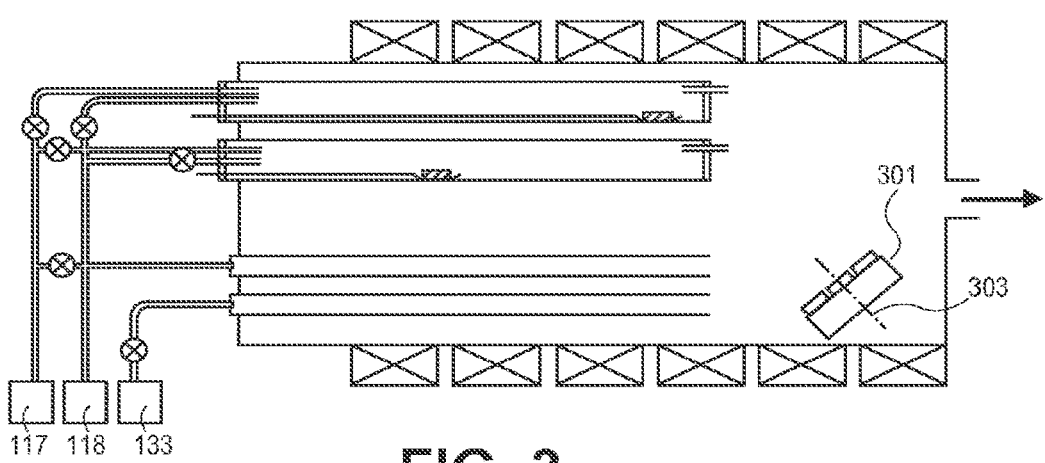
FIG. 3 illustrates a tilted substrate pedestal located in the reactor shown in FIG. 1.

In at least one embodiment of the invention, the gas flows introduced into the growth zone are directed at an angle to the substrate holder surface, such geometry improving material uniformity and reducing defect density. As illustrated in FIG. 3, the gas flows can be horizontal with the pedestal (i.e., pedestal 301) tilted at an angle to the gas flow. Preferably the angle is between 1 and 10 degrees. If desired pedestal 301 can be rotated about axis 303.

Initially the substrate(s) within a particular growth sub-zone is heated to a high temperature within the range of 900° C. and 950° C., thus 10 initiating high quality crystal growth and controlled sample shape. Once crystal growth has been initiated, the source temperature is lowered and maintained at a temperature within the range of 850° C. and 1,000° C., thus allowing rapid crystal growth to be achieved. Preferably the period of high quality crystal growth is at least 10 minutes and the period of rapid crystal growth is at least 12 hours. More preferably the period of high quality crystal growth is at least 30 minutes and the period of rapid crystal growth is at least 24 hours.

During the growth process, after the source material is heated a halide reactive gas, preferably HCl, is introduced into the source tube at a flow rate of 0.1 to 10 liters/minute. Assuming an Al source, $AlCl_3$ and other gas components are formed due to the reaction between the reactive gas and the source. The $AlCl_3$ is transported to the reactor's growth zone by the flow of the inert gas (e.g., Ar), the inert gas having a flow rate of 0.1 to 40 liters/minute. Simultaneously, ammonia gas ($NH_3$) from source 133 is delivered to the growth zone at a flow rate of 0.1 to 10 liters/minute. The ammonia gas and the aluminum chloride gas react to form AlN on the surface of substrate(s) 125. The growth rate is in the range of 1 to 100 microns per hour, and preferably in the range of 20 to 40 microns per hour. After the desired AlN layer thickness has been achieved, the flow of HCl and $NH_3$ gas is stopped and the substrate(s) is cooled in the flowing inert gas.

During crystal growth the growing layer is not allowed to come into contact with any portion of the reactor, thus insuring high quality crystal growth. If required, for example during a long growth run, the growth can be interrupted in order to allow parasitic deposits to be etched off of the reactor's internal components. The quality of the as-grown material can be further improved by introducing buffer or interrupting layers during crystal growth. These layers can be single layer or multi-layer structures and can be comprised, for example, of GaN, InGaN, InGaAlN or other materials. The thickness of these buffer or interrupting layers can be in the range of 50 angstroms to 100 microns. Preferably these layers are grown using the same process used for the boule growth, for example the HVPE process.

The AlN layer can be grown in the direction parallel to the (0001), (11-20), (10-10) and other crystallographic directions. AlN wafers sliced from the as-grown thick AlN layer can have their surface parallel to the (0001), (11-20), (10-10) or other crystallographic planes. The surface-can be on-oriented or mis-oriented by an angle from 0 to 90 degrees toward a specific crystallographic 15 direction, for example a (0001) plane mis-oriented by 8 degrees to the (11-20) direction.

During crystal growth, AlN layer (boule) can be doped with any of a variety of impurities including, but not limited to, magnesium (Mg), zinc (Zn), silicon (Si), oxygen (O), tin (Sn), iron (Fe), chromium (Cr), manganese (Mn), erbium (Er) and indium (In). Doping allows the conductivity of the growing material to be controlled, thereby resulting in n-type, p-type or i-type conductivity. The atomic concentration of these impurities can be varied in the grown material from $10^{15}$ $cm^{-3}$ up to $10^{20}$ $cm^{-3}$. The impurities can be introduced into the growth zone using Ar as a carrier gas with a gas flow rate between 0.1 and 50 liters/minute. Metal source temperatures range from 200° C. to 1200° C. Impurity sources (for example Mg metal) can be etched by HCl before the growth inside the HVPE reactor. Si doping can be done by supplying gaseous silane (for example 50 ppm silane in Ar). Doping uniformity in the (0001) plane is better than 10 percent, preferably better than 5 percent, and still more preferably better than 1 percent.

During crystal growth, the substrate can be moved (e.g., rotated) in order to maintain the desired gas composition and to avoid the negative influence of parasitic deposition on reactor parts.

Wafer Preparation

After a thick crystal layer is grown, for example in accordance with the preferred embodiment previously described, wafers can be sliced from the grown boule. Preferably the slicing operation is performed with a diamond wire saw with a cut width of approximately 200 microns. Depending upon the thickness of the grown boule, 10, 20, 30 or more wafers can be manufactured from a single boule. After slicing, the wafers are ground, polished and etched to remove the damaged surface layer.

The wafers fabricated by the invention can then be used directly, for example as a substrate for a device structure. Alternately, the Group III nitride wafers sliced from the underlying seed substrate can be polished, prepared and used for a seed substrate for the growth of additional wafers. For example, AlN can be initially grown as outlined above using any of a variety of possible substrates (e.g., SiC). After completion of the growth of the AlN thick, crack-free layer, it can be sliced from the underlying substrate and prepared as noted above. Once preparation is complete, the AlN freestanding wafer can be used to grow additional AlN material using the process of the invention. In this example the new AlN material can be grown on either the (000-1)N face or the (0001) Al face of the AlN substrate. Once growth is complete, multiple thin wafers can be cut from the boule of crack-free, AlN material.

Scrubbing System

In a preferred embodiment of the invention, the growth apparatus is equipped with an air scrubbing system to effectively remove all hazardous components and solid particles from the HVPE process exhaust. Such a waste utilization system allows the present HYPE apparatus to operate for the extended periods required to achieve the desired layer thicknesses.

The air scrubbing system consists of a wet scrubber sequentially connected to a wet electrostatic precipitator (ESP) where the scrubber and ESP 11 are either separate units or placed within a single unit with the ESP above the scrubber. The air flow capacity of the scrubbing system is within the range of 50 ACFM to 5000 ACFM. The efficiency to remove HCL and ammonia gases is not less than 99 percent and the efficiency to remove solid particles is not less than 99.9 percent. Typically the gas inlet concentration before the scrubber is up to 15800 PPM for ammonia, up to 6600 PPM for HCl, and up to 2.8 GR/ACFM for solid particles. Up to 100 percent of the solid particles may be comprised of ammonia chloride ($NH_4Cl$) with a particle size in the range of 0.1 to 3.0 microns.

The wet ESP's parts having contact with the gas flow to be scrubbed as well as the wet scrubber and sump tank are preferably constructed of FRP or Hastelloy C-276. The scrubbing liquid is water which is circulated in both the scrubber and the ESP. Prior to discharge, the pH of the scrubbing liquid must be adjusted to be within an allowed level.

Process Applicability

For AlN growth by HVPE processes, layers can be grown on both the (0001) Al face and the (000-1)N face of an AlN substrate.

Applicable to large area substrates (i.e., 2 inch, 3 inch, 4 inch, 6 inch and larger)

Applicable to a variety of substrates (e.g., SiC, AlN, GaAs, sapphire, GaN, etc.)

Applicable to flat, concave, convex or patterned substrates

Applicable to oriented or mis-oriented surfaces (preferably with the mis-orientation angle less than or equal to 0.8 degrees.

Achievable Material Characteristics

Crack-free Group III nitride layers (e.g., AlN, AlGaN, GaN, InN, InGaAlBN, etc.) when the epitaxial growth takes place in the flat growth subzone, the layers grown either directly on the seed substrate or on a buffer layer or an intermediate layer Crack-free Group III nitride (e.g., AlN, AlGaN, GaN, etc.) large area wafers by forming thick, crack-free layers of the desired composition and then separating the grown layer from the initial substrate Layer thickness of 10 microns to 1 cm or more Defect density in as-grown thick layers of less than $10^9$ $cm^{-2}$ preferably less than $10^8$ $cm^{-2}$, and still more preferably less than $10^6$ $cm^{-2}$. These defect densities were achieved without applying lateral overgrowth techniques. Defect densities were measured by calculating etch pit density after etching the samples in hot acid. Low defect densities were verified by measuring the x-ray diffraction rocking curves with an x-ray diffractometer (e.g., full width at a half maximum of the x-ray rocking curve using .omega.-scan geometry was less than 300 arc sec).

Thermal conductivity in as-grown AlN layers of up to 3.3 W/K cm

Electrical resistivity in as-grown layers ranging from $10^7$ to $10^{15}$ Ohm cm (at 300 K)

Colorless

Optically transparent AlN layers in a wavelength range from 200 nm to 6 microns with an optical absorption of less than 5 percent for AlN wafers polished on both sides Shape, stress and lattice constant of the as-grown materials can be controlled by using the multiple growth sub-zones (i.e., concave, convex and flat growth zones) and transferring the substrates from one growth sub-zone to another during the growth process.

Fabrication of semiconductor devices on large area crack-free single crystal Group III nitride wafers (e.g., AlN wafers)

Fabrication of large area substrates (2 inch, 3 inch, 4 inch, 6 inch or larger) of high quality, semi-insulating and of high thermal conductivity substrates for use in ultra high power nitride based high frequency devices, the substrates of the invention allowing the lattice constants and thermal expansion coefficients to be matched to the desired device structures (e.g., AlGaN/GaN-based devices)

No peripheral polycrystalline regions

EMBODIMENTS

Embodiment 1

AlN Material Growth and Wafer Preparation

The growth of AlN material by the inventive process was performed in an inert gas flow at atmospheric pressure in a hot-wall, horizontal reactor chamber. SiC substrates were placed on a quartz pedestal and loaded into the growth zone of the quartz reactor. The growth was performed on the (0001)Si on axis 6H—SiC substrate, the substrates having a surface rms roughness of approximately 0.3 nm or better.

Approximately 1 pound of Al metal (5N) was placed in a sapphire source boat for use in growing the AlN thick layer. For extended runs, typically those requiring a growth cycle of more than 48 hours, multiple Al sources/boats were used, either in parallel or sequentially. The source boat was placed in a quartz source tube (i.e., source channel) within the source zone of the reactor. This source tube (or tubes when multiple Al sources were used) supplied $AlCl_3$ to the growth zone of the reactor. Additional quartz tubes (i.e., channels) were used for ammonia ($NH_3$) delivery and HCl gas delivery to the growth zone, the separate HCl tube being use to etch the SiC substrates.

The reactor was filled with Ar gas, the Ar gas flowing through the reactor at a rate of between 1 and 25 liters per minute. The substrates were then heated in the Ar flow to temperatures in the range of 900° C. to 1150° C. and the Al was heated to temperatures in the range of 700° C. to 900° C. HCl gas was introduced into the growth zone through the HCl channel. As a result of the HCl gas flow, the (0001) Si faces of the SiC substrates were etched prior to film growth. After substrate etching, the HCl gas was introduced into the source zone, i.e., the Al channel(s). As a result of the reaction between HCl and Al, aluminum chloride ($AlCl_3$) was formed and delivered to the growth zone by the Ar flow. At the same time, ammonia gas ($NH_3$) was introduced into the growth zone. As a result of the reaction between the $AlCl_3$ and the $NH_3$, a single crystal epitaxial AlN layer was grown on the substrates. The substrate temperature during the growth was held constant at a temperature within the range 800° C. to 1200° C., different temperatures being used for different epitaxial runs.

Shape controlled epitaxial growth was observed at growth temperatures within the range of 900° C. to 950° C. Depending on HCl flow rate, the growth rate of the AlN material ranged from 0.1 to 1.2 microns per minute. Different epitaxial runs utilized different growth cycle durations, these durations ranging from 10 hours to 100 hours. After a particular growth cycle was completed, all gaseous flows were stopped except for the flow of Ar. The samples were cooled down in the Ar flow and then unloaded from the reactor. The as-grown surface had a (0001) Al orientation.

The SiC substrates were removed from the grown AlN layers by grinding on a grinding wheel and/or reactive ion etching (RIE). For the mechanical grinding process, the sample was glued to a wafer holder by wax and ground with a liquid abrasive. After ungluing the wafer, the traces of wax were removed in hot acetone for 20 minutes. Any residual SiC was removed by RIE and/or wet etching in molten KOH.

The freestanding AlN wafers were then cleaned using a conventional cleaning process and placed in the HVPE reactor. AlN homoepitaxial growth was then performed on the as-grown AlN surface of the AlN wafers. Once again, multiple epitaxial runs were performed in which the growth temperature of a particular run was held constant. The growth temperatures for the various runs were within the range of 900° C. to 1150° C. The growth durations for the various runs were between 10 hours and 100 hours resulting in AlN plates up to 1 cm in thickness. After the sample cool down procedure was complete, wafers ranging from 0.1 to 1 mm in thickness were cut from the AlN plates using 0.005" wire saw. Both sides of the AlN wafers were ground and polished.

Embodiment 2

AlN Material Growth and Wafer Preparation

Using a modified HVPE process, a 400 micron thick AlN boule was grown on a 2 inch SiC substrate at a growth temperature of 900° C. and at a growth rate of 30 microns per hour. The AlN boule was grown in the growth subzone yielding substantially flat layer growth. After completion of the growth cycle, the SiC substrate was removed by a combination of chemical etching, RIE and mechanical polishing. The resultant AlN wafer was polished, etched and cleaned and then re-introduced into the flat growth sub-zone of the HVPE reactor. A 1 centimeter thick AlN boule was grown on the (0001)N face of the prepared AlN seed wafer, the resultant boule being crack-free.

The AlN boule was sliced into 8, 2-inch AlN wafers with thicknesses ranging from 200 to 500 microns. X-ray diffraction studies showed that the AlN wafers had a single crystal structure (e.g., the FWHM of the x-ray RC was less than 300 arc sec).

The AlN wafers were subjected to chemical-mechanical polishing, the resultant wafers exhibiting a surface roughness of less than 0.3 nm The damaged surface sub-layer was removable by wet and/or dry etching. A RHEED study showed that the surfaces of the wafers were damage free. The final wafers were crack-free, colorless and transparent and had less than 20 microns of bowing.

Embodiment 3

AlN Device Fabrication

The growth of AlN material by the inventive process was performed in an inert gas flow at atmospheric pressure in a hot-wall, horizontal reactor chamber. Two inch SiC substrates were placed on a quartz pedestal and loaded into the growth zone of the quartz reactor, positioned for AlN deposition on the (0001)Si on-axis surface.

Approximately 1 kilogram of Al metal was placed in the source boat. After purging the reactor with Ar gas, the growth zone and the Al source zone were heated to 920° C. and 750° C., respectively. To prepare the substrates for AlN deposition, HCl gas was introduced into the growth zone to etch the SiC substrates. The HCl gas was then introduced into the Al source zone, thereby forming aluminum chloride that was transported into the growth zone by the Ar carrier gas. Simultaneously, $NH_3$ gas was introduced into the growth zone, the $NH_3$ gas providing a source of nitrogen. As a result of the reaction between the aluminum chloride and the $NH_3$ gases, an AlN layer was grown on the SiC surface. The $NH_3$ and aluminum chloride gases were expelled from the reactor by the flow of the Ar gas. After allowing the growth process to continue for a period of 2 hours, the flow of HCl and $NH_3$ gases was stopped and the furnace was slowly cooled down to room temperature with Ar gas flowing through all of the gas channels. The reactor was then opened to the air and the sample holder was removed. As a result of this growth process, a crack-free AlN layer 51 microns thick was grown on the SiC substrates.

To prepare AlN substrates for further processing, the SiC substrates were removed from the grown AlN material by chemically etching the material in molten KOH. The etching was carried out in a nickel crucible at a temperature within the range of 450° C. to 650° C. Prior to beginning the etching process, the molten KOH was maintained at the etching temperature for several hours to remove the moisture from the melt and the crucible. Once the substrates were placed within the molten KOH, only a few hours were required to etch away most of the SiC substrates from the grown AlN. This process for substrate removal is favored over either mechanical or laser induced substrate removal. The remaining SiC substrate was removed by RIE in a $Si_3F$/Ar gas mixture. For some of the samples, polycrystalline material was noted in the peripheral regions, this material being subsequently removed by grinding. Additionally, in some instances the surface of the as-grown material required mechanical polishing to smooth the surface. In these instances, after the polishing was completed, RIE or chemical etching was used to remove the thin surface layer damaged during polishing. As a result of this procedure, the desired AlN seeds were obtained. The high quality of the resultant material was verified by the x-ray rocking .omega.-scan curves (e.g., 300 arc sec for the full width at half maximum (FWHM) for the (0002) AlN reflection). X-ray diffraction measurements showed that the as-grown material was 2H—AlN.

The inventors have found that SiC substrates are preferable over sapphire substrates during the initial growth process as the resultant material has a defined polarity. Specifically, the resultant material has a mixture of aluminum (Al) polarity and nitrogen (N) polarity. The side of the as-grown material adjacent to the SiC substrates has an N polarity while the opposite, outermost layer of the material has an Al polarity.

Prior to growing the next thick AlN layer, those samples that had had the most material removed during the substrate removal and surface preparation steps underwent further preparation. Specifically a thin AlN layer, typically in the range of 10 to 100 microns thick, was grown on one or both sides of the AlN wafers in question. The additional material improved the mechanical strength of these substrates and, in general, prepared the AlN surface for bulk growth. Prior to bulk growth, the AlN seed substrates were approximately 1 millimeter thick and approximately 6 centimeters in diameter.

The growth of the AlN thick layer (boule) used the same reactor as that used to grow the AlN layers described above. The substrates were positioned within the reactor such that the new material would be grown on the (0001) Al on-axis face. It should be noted that the (0001) surface can be tilted to a specific crystallographic direction (e.g., [11-20]) and that the tilt angle can be varied between 0.5 and 90 degrees. In the present embodiment, the tilt angle was zero.

In addition to loading the seed substrates into the growth zone of the reactor, two kilograms of Al was loaded into the source boats of multiple Al source tubes. After purging the reactor with Ar gas, the growth zone and the Al source zone were heated to 930° C. and 750° C., respectively. Prior to initiating AlN growth, a mixture of $NH_3$ and HCl gas was introduced in the growth zone to refresh the surfaces of the substrates. As in the previous growth, HCl was introduced into the Al source zone to form aluminum chloride that was then transported to the growth zone by the Ar carrier gas. At the same time, $NH_3$ gas used as a source of nitrogen was introduced into the growth zone. The AlN was formed by the reaction between the gallium chloride and the $NH_3$ gases.

This growth process was allowed to continue for approximately 40 hours. After that, both HCl flow and $NH_3$ flow were stopped. The furnace was slowly cooled down to room temperature with Ar flowing through all gas channels. The reactor was then opened to the air and the sample holder was removed from the reactor. The resultant boule had a diameter of approximately 6 centimeters and a thickness of approximately 1 centimeter. The crystal had a single crystal 2H polytype structure as shown by x-ray diffraction measurements.

After growth, the boule was machined to a perfect cylindrical shape with a 5.08 centimeter diameter (i.e., 2 inch diameter), thereby removing defective peripheral areas. One side of the boule was ground to indicate the (11-20) face. Then the boule was sliced into 12 wafers using a horizontal diamond wire saw with an approximately 200 micron diamond wire. Before slicing, the boule was oriented using an x-ray technique in order to slice the wafers with the (0001) oriented surface. The slicing rate was about 1 millimeter per minute. The wire was rocked around the boule during the slicing. Thickness of the wafers was varied from 150 microns to 400 microns. Wafer thickness uniformity was better than 5 percent.

After slicing, the wafers were polished using diamond abrasive suspensions. Some wafers were polished only on the Al face, some wafers were polished only on the N face, and some wafers were polished on both sides. The final surface treatment was performed using an RIE and/or a chemical etching technique to remove the surface layer damaged by the mechanical treatment. The surface of the wafers had a single crystal structure as shown by high-energy electron diffraction techniques. The surface of the finished AlN wafers had a mean square roughness, rms, of 2 nanometers or less as determined by atomic force microscopy utilizing a viewing area of 5 by 5 microns. The defect density was measured using wet chemical etching in hot acid. For different wafers, etch pit density ranged from 10 to 1000 per square centimeter. Some AlN wafers were subjected to heat treatment in an argon atmosphere in a temperature range from 450° C. to 1020° C. in order to reduce residual stress. Raman scattering measurements showed that such heat treatment reduced stress from 20 to 50 percent.

In order to compare the performance of devices fabricated using the AlN substrates fabricated above to those fabricated on SiC and sapphire, AlN homoepitaxial layers and pn diode multi-layer structures were grown. Device structures included AlGaN/GaN structures. Prior to device fabrication, surface 30 contamination of the growth surface of the AlN wafers was removed in a side growth reactor with a $NH_3$—HCl gas mixture. The thickness of individual layers 19 varied from 0.002 micron to 200 microns, depending upon device structure. For example, high frequency device structures (e.g., heterojunction field effect transistors) had layers ranging from 0.002 to 5 microns. For high power rectifying diodes, layers ranged from 1 to 200 microns. In order to obtain p-type layers, a 5 Mg impurity was used while n-type doping was obtained using a Si impurity. The fabricated device structures were fabricated employing contact metallization, photolithography and mesa insulation.

The structures fabricated on the AlN wafers were studied using optical and electron microscopy, secondary ion mass spectrometry, capacitance-voltage and current-voltage methods. The devices showed superior characteristics compared with devices fabricated on SiC and sapphire substrates. Additionally, it was noted that the wafer surface cleaning procedure in the reactor reduced defect density, including dislocation and crack density, in the grown epitaxial layers.

Embodiment 4

AlN Device Fabrication

In this embodiment, AlN material was grown in an inert gas flow at atmospheric pressure utilizing the hot-wall, horizontal reactor described in Embodiment 3. Two inch diameter SiC substrates of a 6H polytype were placed on a quartz pedestal and loaded into the flat growth sub-zone of the quartz reactor. The substrates were located such that the (0001) Si on-axis surfaces were positioned for AlN deposition. Approximately 0.5 kilograms of Al (7N) was located within a quartz boat in the Al source zone of the reactor. This channel was used for delivery of aluminum chloride to the growth zone of the reactor. A second quartz tube was used for ammonia ($NH_3$)

delivery to the growth zone. A third separate quartz tube was used for HCl gas delivery to the growth zone.

The reactor was filled with Ar gas, the Ar gas flow through the reactor being in the range of 1 to 25 liters per minute. The substrates were then heated in Ar flow to a temperature of 920° C. and the hot portion of the metal Al source was heated to a temperature in the range of 750° C. to 800° C. HCl gas was introduced into the growth zone through the HCl channel. As a result, the SiC seed substrates were etched at Ar—HCl ambient before initiating the growth procedure. Additionally the seed was etched with aluminum chloride gas.

To begin the growth process, HCl gas was introduced into the Al source zone, creating aluminum chloride that was delivered to the growth zone by Ar gas flow. Simultaneously, $NH_3$ was introduced into the growth zone. As a result of the reaction between the aluminum chloride gas and the ammonia gas, a single crystal epitaxial AlN layer was grown on the substrates. The substrate temperature during the growth process was held constant at 920° C. After a growth period of 20 hours, the flow of HCl and $NH_3$ were stopped and the samples were cooled in flowing Ar.

As a result of the growth process, six AlN/SiC samples were obtained in which the AlN thickness was in the range of 1 to 3 millimeters. To remove the SiC substrates, the samples were first glued to metal holders using mounting wax (e.g., QuickStick™. 135) at a temperature of 130° C. with the AlN layer facing the holder. The holders were placed on a polishing machine (e.g., SBT Model 920) and a thick portion of the SiC substrates were ground away using a 30 micron diamond suspension at 100 rpm with a pressure of 0.1 to 3 kilograms per square centimeter. This process was continued for a period of between 8 and 24 hours. After removal of between 200 and 250 microns of SiC, the samples were unglued from the holders and cleaned in hot acetone for approximately 20 minutes.

The residual SiC material was removed from each sample using a reactive ion etching (RIE) technique. Each sample was placed inside a quartz etching chamber on a stainless steel holder. The RIE was performed using $Si_3F/Ar$ for a period of between 5 and 12 hours, depending upon the thickness of the residual SiC. The etching rate of SiC in this process is about 10 microns per hour. After the RIE process was completed, the samples were cleaned to remove possible surface contamination. As a result of the above processes, freestanding AlN plates completely free of any trace of SiC were obtained.

After completion of a conventional cleaning procedure, the AlN plates were placed in the HYPE reactor. An AlN homoepitaxial growth was started on the as-grown (0001) Al surface of the AlN plates. The growth temperature was approximately 910° C. After a period of growth of 10 minutes, the samples were cooled and unloaded from the reactor. The AlN layer grown on the AlN plates was intended to cover defects existing in the AlN plates. Accordingly, the samples at the completion of this step were comprised of 2 inch diameter AlN plates with approximately 10 microns of newly grown AlN. Note that for some samples an AlN layer was grown not only on the (0001) Al face of the AlN plates, but also on the (000-1)N face of the plates. Peripheral highly defective regions of the AlN plates were removed by grinding.

Three of the AlN plates from the previous process were loaded into the reactor in order to grow thick AlN layers. Aluminum chloride (this term includes all possible Al—Cl compounds, for example $AlCl_3$) and ammonia gas served as source materials for growth as previously disclosed. In addition, during the growth cycle the AlN boules were doped with silicon supplied to the growth zone by $S_2H_4$ gas. Growth temperatures ranged from 910° C. to 920° C. and the growth run lasted for 48 hours. Three layers with thicknesses of 5 millimeters, 7 millimeters, and 9 millimeters, respectively, were grown in the flat growth zone.

The layers were sliced into AlN wafers. Prior to wafer preparation, some of the boules were ground into a cylindrical shape and peripheral polycrystalline AlN regions, usually between 1 and 2 millimeters thick, were removed. Depending upon wafer thickness, which ranged from 150 to 500 microns, between 7 and 30 wafers were obtained per boule. The wafers were then polished on either one side or both sides using an SBT Model 920 polishing machine with a 15 micron diamond suspension at 100 rpm with a pressure of between 0.5 and 2 kilograms per square centimeter for 9 minutes per side. After cleaning all parts and the holder for 5 to 10 minutes in water with soap, the polishing process was repeated with a 5 micron diamond suspension for 10 minutes at the same pressure. After subjecting the parts and the holder to another cleaning, the wafers were polished using a new polishing cloth and a 0.1 30 micron diamond suspension for an hour at 100 rpm with a pressure of between 0.5 and 2 kilograms per square centimeter.

After cleaning, the AlN wafers were characterized in terms of crystal structure, electrical and optical properties. X-ray diffraction showed that the wafers were single crystal AlN with a 2H polytype structure. The FWHM of the x-ray rocking curve measured in .omega.-scanning geometry ranged from 60 to 760 arc seconds for different samples. After chemical etching, the etch pit density measured between 100 and 10,000 per square centimeter, depending upon the sample. Wafers had n-type conductivity with a concentration $N_d$—$N_a$ of between $5 \times 10^{18}$ and $9 \times 10^{18}$ per cubic centimeter. The wafers were used as substrates for device fabrication, particularly for AlN/AlGaN multi-layer device 10 structures grown by the MOCVD process.

Embodiment 5

Fabrication of Thick AlN Wafers

After growing AlN on SiC substrates and separating the SiC substrate as disclosed above, a crack-free 5 mm thick AlN layer was grown at 910° C. by the previously described HYPE process on the (0001) Al face of the 3 inch diameter freestanding AlN substrate. The (0001) Al face was prepared for thick AlN epitaxial growth by RIE. The AlN growth rate was 50 microns per minute, the duration of the growth cycle was 100 hours, and the growth process was performed in the flat growth sub-zone.

The 5 mm thick AlN layer was sliced by diamond wire into eight AlN wafers. These wafers were polished by a chemical-mechanical process to reduce the surface roughness rms down to 0.1 nm as measured by AFM. For some wafers the (000-1) N face was polished and for other wafers the (0001) Al face was polished. A sub-surface layer of about 0.1 microns that was damaged by the mechanical treatment was removed by dry etching. The resultant 3 inch AlN wafers had more than 90 percent usable area for device formation. Some wafers were on-axis and some wafers were mis-oriented from the (0001) surface in the range of 0 to 10 degrees. The wafers had a bow of less than 30 microns. The wafers contained no polytype inclusions or mis-oriented crystal blocks. The AlN wafers had a 2H crystal structure. Cathodoluminescence measurements revealed near band edge luminescence in the wavelength range from 5.9 to 6.1 eV. The wafers were crack-free, colorless, and optically transparent. Etch pit 23 density measured by hot wet etching was less than $10^7$ cm$^{-2}$. The defect density at the top of the thick AlN layer was less than in the initial AlN wafer. The wafers had between 1 and 5 macrodefects with a size larger than 0.1 mm. For different samples, the FWHM of x-ray rocking curves ranged from 60 to 1200 arc sec. The 5 atomic concentrations of Si and carbon contamination was less than $10^{18}$ cm$^{-3}$. The oxygen concentration in the wafers ranged from $10^{18}$ to $10^{21}$ cm$^{-3}$.

Embodiment 6

Device Fabrication

A number of devices were fabricated to further test the benefits of the presently developed, crack-free AlN layers. In all of the devices described within this section, the AlN or other Group III nitride substrates were fabricated in accordance with the techniques described above. Additionally, where thick homoepitaxial layers were grown on the substrate prior to the device fabrication, these thick layers were grown in accordance with the invention.

Figure 4:
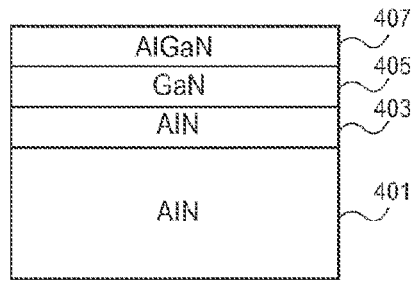
FIG. 4 illustrates a HEMT device fabricated in accordance with the invention.

A high electron mobility transistor (HEMT) was fabricated as shown in FIG. 4. The device was comprised of an AlN substrate 401 and an AlN homoepitaxial layer 403 grown at 1000° C. on substrate 401 having a (0001) Al surface orientation. Layer 403's thickness was 12 microns in one device fabrication run and 30 microns in another device fabrication run. Although not required, the thick AlN homoepitaxial layer reduces defect density in the final device structure and improves device performance. The AlN layers were crackfree as verified by transmission and reflection optical microscopy with magnifications up to 1000×. In the same HVPE growth process, a GaN layer 405 and an AlGaN layer 407 were grown to form the HEMT structure. The thickness of GaN layer 405 was about 0.2 microns and the thickness of AlGaN layer 407 was about 30 nm Depending upon the sample, the AlN content in the AlGaN layer ranged from 10 to 50 mol. %. X-ray diffraction study verified that all device layers were grown. Source, drain and gate contacts were also added to the AlGaN active structure (not shown). It will be appreciated that the GaN/AlGaN structure could have been fabricated by MOCVD and/or MBE techniques. The HEMT structures displayed 2DEG mobility up to 2000 cm$^2$ V sec (300 K), operating frequency from 1 to 100 GHz, and an operating power for a single transistor of 10 W, 20 W, 50 W and 100 W or more depending upon the size of the device.

Figure 5:
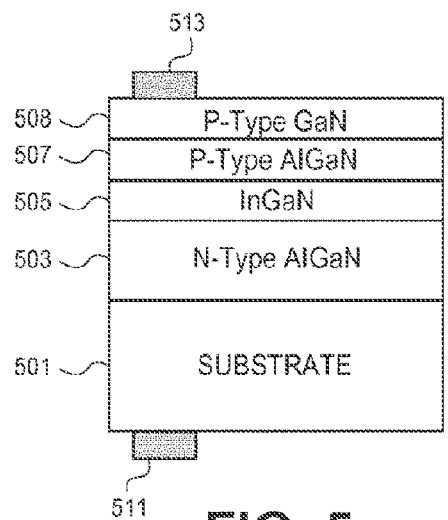
FIG. 5 illustrates a first embodiment of a light emitting diode fabricated in accordance with the invention.
Figure 6:
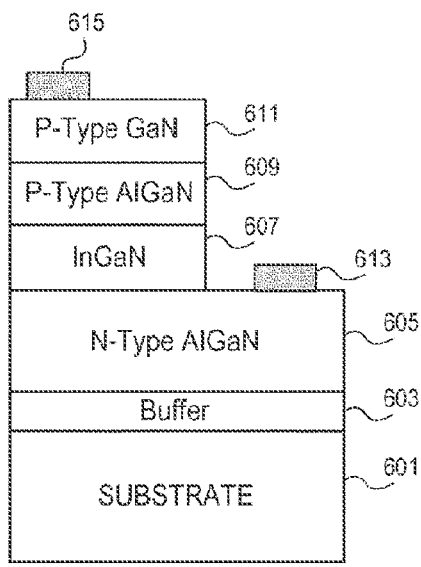
FIG. 6 illustrates a second embodiment of a light emitting diode fabricated in accordance with the invention.
Figure 7:
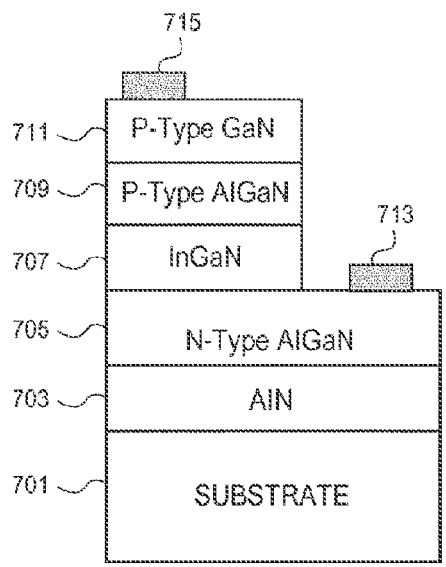
FIG. 7 illustrates a third embodiment of a light emitting diode fabricated in accordance with the invention.

Light emitting diodes (LEOs) capable of emitting light in a color selected from the group consisting of red, green, blue, violet and ultraviolet were fabricated (shown in FIGS. 5-7). The tested LEOs had a peak emission wavelength from about 200 to 400 nm and an output power from 0.001 to 100 mW (20 mA). In at least one embodiment the Group III nitride substrate 501 was comprised of n-type AlGaN or AlN while in at least one other embodiment substrate 601 was comprised of AlN (e.g., substrates 601 and 701). The embodiment illustrated in FIG. 5 is further comprised of an n-type layer 503 of AlGaN, an InGaN quantum well layer 505, a p-type AlGaN layer 507, a p-type GaN layer 509, a first ohmic contact 511 deposited on substrate 501, and a second ohmic contact 513 deposited on GaN layer 509. The embodiment illustrated in FIG. 6 is further comprised of a buffer layer 603, an n-type layer 605 of AlGaN, an InGaN quantum well layer 607, a p-type AlGaN layer 609, a p-type GaN layer 611, a first ohmic contact 613 deposited on said n-type layer 605 of AlGaN, and a second ohmic contact 615 deposited on GaN layer 611. The embodiment illustrated in FIG. 7 is further comprised of an AlN layer 703 at least 10 microns thick, an n-type layer 705 of AlGaN, an InGaN quantum well layer 20 707, a p-type AlGaN layer 709, a p-type GaN layer 711, a first ohmic contact 713 deposited on said n-type layer 705 of AlGaN, and a second ohmic contact 715 deposited on GaN layer 711.

As will be understood by those familiar with the art, the present invention can be embodied in other specific forms without departing from the spirit or essential characteristics thereof. Accordingly, the disclosures and descriptions herein are intended to be illustrative, but not limiting, of the scope of the invention which is set forth in the following claims.

What is claimed:

1. Method for producing a III-N (AlN, GaN, Al$_x$Ga$_{(1-x)}$N) crystal by Vapor Phase Epitaxy (VPE), the method comprising:
   providing a reactor having:
      a growth zone for growing a III-N crystal;
      a substrate holder located in the growth zone that supports at least one substrate on which to grow the III-N crystal;
      a gas supply system that delivers growth material for growing the III-N crystal to the growth zone from an outlet of the gas supply system; and
      a heating element that controls temperature in the reactor;
   determining three growth sub-zones in the growth zone for which a crystal grown in the growth sub-zones has respectively a concave, flat or convex curvature;
   growing the III-N crystal on a substrate in a growth region for which the crystal has a desired curvature.

2. A method according to claim 1 wherein the crystal is crack-free.

3. A method according to claim 1 wherein the desired curvature is concave.

4. A method according to claim 1 wherein the desired curvature is flat.

5. A method according to claim 1 wherein the desired curvature is convex.

6. A method according to claim 1 wherein growing the crystal comprises moving the crystal from one to the other of the growth sub-zones.

7. The method of claim 1, and comprising selecting the substrate from the group consisting of Si substrates, SiC substrates, AlN substrates, AlGaN substrates, GaN substrates, GaAs substrates, and sapphire substrates.

8. A method according to claim 1 wherein the substrate has a diameter greater than about 2 inches.

9. A method according to claim 1 wherein the substrate has a diameter greater than about 4 inches.

10. A method according to claim 1 wherein the substrate has a diameter greater than about 6 inches.

11. A method according to claim 1 wherein determining the growth sub-zones comprises adjusting distance of the growth sub-zones relative to the outlet from which the gas supply system delivers growth material.

12. A method according to claim 1 wherein determining the growth sub-zones comprises controlling the heating element to adjust temperature of the substrate holder.

13. A method according to claim 1 wherein determining the growth sub-zones comprises controlling the heating element to adjust temperature distribution of the substrate holder.

14. A method according to claim 1 and growing the crystal along a growth direction to a thickness equal to or greater than about 10 microns.

15. A method according to claim 1 and growing the crystal along a growth direction to a thickness equal to or greater than about 50 microns.

16. A method according to claim 1 and growing the crystal along a growth direction to a thickness equal to or greater than about 100 microns.

17. A method according to claim 1 and growing the crystal along a growth direction to a thickness equal to or greater than about 1 mm.

18. A method according to claim 1 and growing the crystal along a growth direction to a thickness equal to or greater than about 10 mm.

19. A method according to claim 1 and growing the crystal along a growth direction to a thickness equal to or greater than about 50 mm.

* * * * *